SELECTIVE SIGNALING APPARATUS

Filed Sept. 23, 1965

INVENTORS
FRANK B. FLINT
ROBERT W. HOUSMAN
BY Wolf, Greenfield + Hieken
ATTORNEYS

United States Patent Office 3,353,416
Patented Nov. 21, 1967

3,353,416

SELECTIVE SIGNALING APPARATUS

Frank B. Flint, Weymouth, and Robert W. Housman, Winthrop, Mass., assignors to Automatic Radio Manufacturing Co., Inc., Melrose, Mass., a corporation of Massachusetts Filed Sept. 23, 1965, Ser. No. 489,579
16 Claims. (Cl. 74—10.6)

ABSTRACT OF THE DISCLOSURE

A radio receiver has means for continuously tuning any station and for automatically selecting a favorite station. A favorite station is chosen for automatic selection by first pulling the tuning knob away from the front panel to mechanically decouple a tuning helix from a cam follower on a pin and then adjusting a favorite station selecting knob until the favorite station is then tuned in to establish a return cam position corresponding to the tuning position for the favorite station. The tuning knob may then be released, and the receiver tuned by rotating this knob. The favorite station may then be selected automatically by momentarily pulling the tuning knob away from the panel to mechanically decouple the tuning helix from the cam follower on the pin and allow a return spring to urge the return cam to the previously selected position corresponding to the tuning position of the chosen favorite station.

The present invention relates in general to selective signaling apparatus and more particularly concerns a novel radio tuning device that is characterized by the ease with which a favorite station may be designated for automatic selection and the station thereafter selected many times with relatively simple and inexpensive apparatus. Another feature of the invention resides in the positive means for effecting tuning while preventing the tuning mechanism from being damaged when the extremities of the tuning range are reached.

Push button tuning mechanisms for facilitating rapid and automatic selection of favorite stations are well known in the art. However, such tuning mechanisms are relatively expensive and materially add to the cost of a radio receiver.

Accordingly, it is an important object of the present invention to provide methods and means for rapidly and easily choosing a favorite station for automatic selection with relatively inexpensive reliable apparatus.

It is another object of the invention to achieve the preceding object with manual tuning means that prevents damage to the tuning mechanism when the extremity of the range has been reached and the tuning knob advanced beyond a position corresponding to such extremity.

According to the invention, there is an adjustable tuning element, typically an inductor with a movable slug. First means for adjusting the tuning are mechanically coupled to the tuning element. Second means for adjusting the tuning of the element when the first means for tuning are mechanically decoupled from the tuning element are mechanically coupled to the tuning element and may simultaneously adjust a means for establishing a selected tuning position of the tuning element when the first means for tuning is mechanically decoupled from the tuning element.

According to the method of the invention, the automatically selectable tuning position is established by first mechanically decoupling the first means for tuning, and then adjusting the second means for tuning while the first means for tuning is mechanically decoupled until the preselected tuning position is established. This position may then be automatically selected by temporarily mechanically decoupling the first means for tuning from the tuning element.

Another feature of the invention resides in rotatable means defining a spiral path about the axis of rotation and follower means arranged to travel along a linear path to positions along that path determined by rotation of the means defining the spiral path, the follower means being restricted to a path along said helical path and said linear path.

Numerous other features, objects and advantages of the invention will become apparent from the following specification when read in connection with the accompanying drawing in which.

Figure 1:
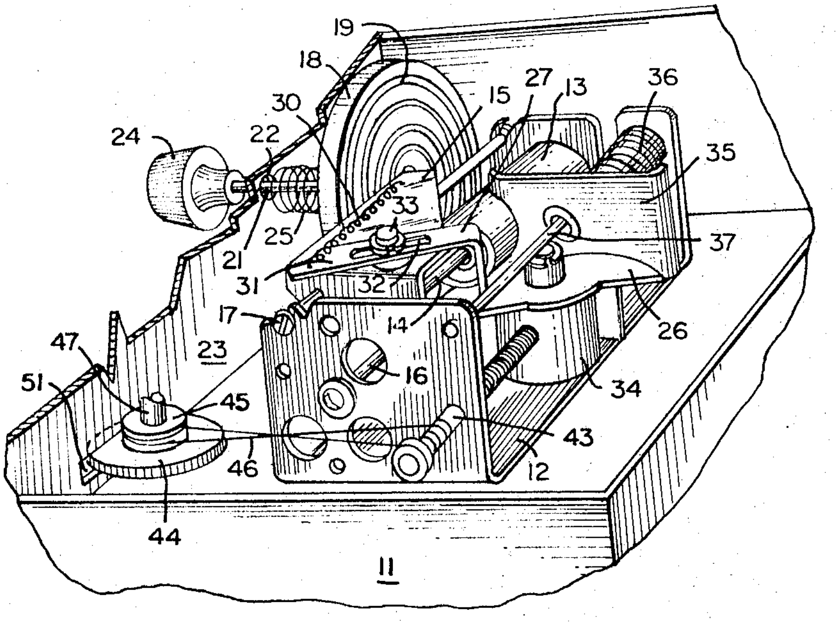
FIG. 1 is a perspective view of an exemplary embodiment of the invention.
Figure 2:
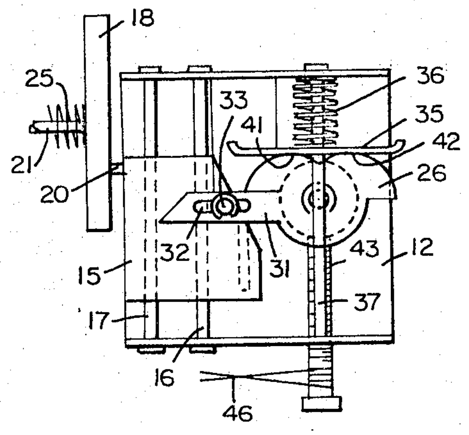
FIG. 2 is a view of the twin bump camming arrangement in a preferred embodiment of the invention.
Figure 4:
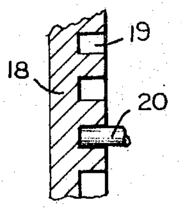
FIG. 4 is an enlarged partial diametrical sectional view along section 4—4 of FIG. 3.

With reference now to the drawing and more particularly FIG. 1 thereof, there is shown a perspective view of tuning apparatus according to the invention. So as not to obscure the principles of the invention, only a single movable tuning rod is shown. However, it is to be understood that the principles of the invention are applicable in a receiver having a number of ganged tuning elements. Details of the invention are also clarified by omitting the electronic components of the complete receiver.

Referring to FIG. 1 there is shown a radio receiver chassis 11 supporting the tuning subassembly chassis 12. Subassembly chassis 12 supports a coil housing 13, which may include one or more slug tuned coils having inductance controlled by slugs (not shown) determined by the position of tuning rod 14 axially displaced in correspondence with the movement of tuning carriage 15 arranged to slide on the horizontal carriage rods 16 and 17 supported in the ends of subassembly chassis 12.

Tuning carriage 15 is formed with a horizontal pin 20, preferably having a cam follower (not shown) on the end that rides in the spiral groove 19 formed in the main tuning helix 18 arranged to rotate about the axis of tuning shaft 21 supported in the opening 22 of the front panel 23 of chassis 11. Tuning knob 24 is attached to tuning shaft 21. A coil spring 25 surrounds tuning shaft 21 and normally urges tuning helix 18 so that the cam follower at the end of pin 20 normally rides in the spiral groove 19. As knob 24 is rotated, pin 20 moves radially inward and outward along a horizontal path to cause carriage 15 to translate correspondingly and adjust the displacement of tuning rod 14 correspondingly.

When knob 24 is moved away from front panel 23 to disengage spiral groove 19 of helix 18 from pin 20, the position of carriage 15 is then controlled by a second means for tuning to now be described. A return cam lever 26 is formed with an L-shaped portion 27 having preload spring 30 attached to a stem 31 immediately above tuning carriage 15. Stem 31 is formed with a groove 32 that accommodates a stud 33 extending upward from carriage 15 so that groove 32 may translate along and rotate about stud 33 while effectively positioning carriage 15 as cam lever 26 rotates about the axis of favorite station adjust bushing 34. A return cam 35 and a return cam spring 36 ride along a horizontal support rod 37 with spring 36 urging return cam 35 against return cam lever 26 until the latter assumes its stable position corresponding to the two bumps 41 and 42 being in contact with return cam 35. At this time stem 31 acting on stud 33 riding in groove 32 positions carriage 15 so that tuning rod 14 adjusts the slug positions in the coil housing 13 at a position corresponding to a desired favorite station of the listener which position and station can be changed by laterally displacing the favorite station adjust bushing 34.

Favorite station adjust bushing 34 rides on favorite station adjust feedscrew 43 which is rotated when favorite station select knob 44 having pulley 45 carrying string 46 is rotated about the axis of its vertical supporting shaft 47. Favorite station select knob 44 extends through the horizontal slot 51 in front panel 23 to provide the operator of the receiver with access to knob 44 so that he may designate any station as a favorite station for automatic selection.

A favorite station is chosen for automatic selection by first pulling knob 24 away from panel 23 to mechanically decouple tuning helix 18 from the cam follower on pin 20 and then adjusting favorite station selecting knob 44 until the favorite station is then tuned in. Knob 24 may then be released, and the receiver tuned by rotating knob 24. If the favorite station thus chosen is to be selected automatically, it is only necessary to momentarily pull knob 24 away from panel 23 to mechanically decouple tuning helix 18 from the cam follower on pin 20 and allow return spring 36 to urge return cam 35 against the one of bumps 41 and 42 then in contact with return cam 35 until the other bump also contacts return cam 35 to thereby automatically tune in the chosen favorite station.

Figure 3:
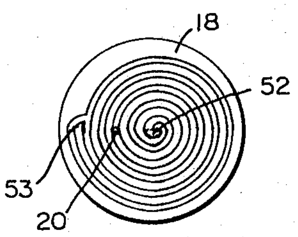
FIG. 3 is a view of the means defining a helical path helpful in understanding how overtravel damage is avoided.

Referring to FIG. 3, there is shown a plan view of tuning helix 18 to facilitate understanding a feature of the invention by which rotating the tuning knob 24 beyond a point corresponding to the limits of linear travel of the tuning carriage 15 causes no damage whatsoever. At one extreme pin 20 is located in the center 52 of spiral groove 19 so that continuing clockwise movement results only in tuning helix 52 rotating about essentially stationary pin 20. At the other extreme with pin 20 at the outermost point 53 of spiral groove 19, continued counterclockwise movement merely results in pin 20 jumping inward slightly to the start of the outermost revolution.

While the specific structure described above has a number of advantages, the invention may also be practiced with alternative structure. For example, the tuning helix and associated pin could be replaced by a rack and pinion arrangement or by a friction disc with associated clutch means. Numerous different camming arrangements could be substituted for the specific especially advantageous one described above. Numerous other modifications of, departures from and uses of the specific embodiment described herein will be apparent to those skilled in the art without departing from the inventive concepts. Consequently, the invention is to be construed as limited solely by the spirit and scope of the appended claims.

What is claimed is:

1. Selective signaling apparatus comprising,
   a mechanically tunable electrical element,
   first means mechanically coupled to said tuning element for continuously adjusting the movable portion thereof over a continuous tuning range,
   second means mechanically coupled to said tuning element for continuously adjusting said movable portion to any selected position within said continuous tuning range when said first means is mechanically decoupled from said tuning element and simultaneously adjusting the position of a preselected tuning position means,
   said preselected tuning position means comprising spring loaded camming means,
   and means for selectively decoupling said first means for tuning from said tunable element to cause said movable portion to assume the position determined by said preselected tuning position means.

2. Selective signaling apparatus in accordance with claim 1 wherein said spring loaded camming means comprises,
   a return cam,
   a return cam lever means,
   and return cam spring means urging said return cam against said return cam lever means.

3. Selective signaling apparatus in accordance with claim 2 wherein said spring loaded camming means comprises means including said return cam spring means for urging said retrun cam against said return cam lever means to a stable position in which said return cam lever and said return cam are in contact at two spaced points on opposite sides of a line passing through the pivot axis of said return cam lever means.

4. Selective signaling apparatus in accordance with claim 3 wherein said preselected tuning position means comprises means for supporting said camming means for translation along said line passing through said pivot axis.

5. Selective signaling apparatus in accordance with claim 4 wherein said second means comprises a feedscrew embracing both a plane including said line passing through said pivot axis and said pivot axis,
   and means for rotating said feedscrew to translate said pivot axis along said line.

6. Selective signaling apparatus in accordance with claim 5 wherein the means mechanically coupling said second means to said movable portion comprises stud means riding in means defining a groove for converting angular movement about said pivot axis into linear movement of said movable portion.

7. Selective signaling apparatus in accordance with claim 5 wherein said camming means comprises a first translatable means having a substantially smooth surface and a second pivotable means having first and second curved surfaces contacting said smooth surface at said first and second points respectively when in said stable position.

8. Selective signaling apparatus in accordance with claim 7 wherein said first means comprises,
   rotatable means defining a helical groove substantially in a plane and extending angularly about an axis of rotation,
   cam follower means,
   means for supporting said rotatable means for rotational movement about said axis of rotation,
   and means for supporting said cam follower means to ride in said groove while restricting said cam follower means to translational movement along a line of direction substantially perpendicular to said axis of rotation.

9. Selective signaling apparatus in accordance with claim 8 wherein said first means further comprises means for supporting said cam follower means and said movable portion in relative fixed relationship.

10. Selective signaling apparatus in accordance with claim 9 wherein said means for selectively decoupling said first means for tuning from said tunable element comprises means for selectively disengaging said cam follower means and said helical groove.

11. Selective signaling apparatus in accordance with claim 10 wherein said means for selectively disengaging comprises means for supporting said rotatable means for translation along said axis of rotation,
   and spring means for normally urging said rotatable means against said cam follower means.

12. Selective signaling apparatus in accordance with claim 11 wherein said rotatable means is formed with said helical groove embracing said axis of rotation and spiralling radially outward from said axis of rotation with the end of the outermost convolution coupled to the penultimate convolution to define limits of translation of said cam follower means between said axis of rotation and the radial distance to said latter end while constraining said cam follower means to within said limits however said rotatable means is rotated about said axis.

13. A selective mechanism comprising, rotatable means defining a helical groove substantially in a plane and extending angularly about an axis of rotation, cam follower means, means for supporting said rotatable means for rotational movement about said axis of rotation, means for supporting said cam follower means to ride in said groove while restricting said cam follower means to movement along a prescribed curve extending outward from said axis of rotation, said rotatable means being formed with said helical groove embracing said axis of rotation and spiralling radially outward from said axis of rotation with the end of the outermost convolution coupled to the penultimate convolution to define limits of movement of said cam follower means along said prescribed curve between said axis of rotation and the radial distance to said latter end while constraining said cam follower means to within said limits however said rotatable means is rotated about said axis of rotation.

14. A positioning mechanism comprising, a cam lever means, and means for urging said cam and said cam lever means together to a stable position in which said cam and said cam lever are in contact at two spaced points on opposite sides of a line passing through a pivot axis about which one of said cam and cam lever means may pivot, means for supporting said one of said cam and cam lever means for pivotal movement about said pivc axis, and means for translating said pivot axis.

15. A positioning mechanism comprising, a cam, cam means lever, means for urging said cam and said cam lever mean together to a stable position in which said cam an said cam lever are in contact at two spaced point on opposite sides of a line passing through a pivo axis about which one of said cam and cam leve means may pivot, and means for supporting said one of said cam an cam lever means for pivotal movement about sai pivot axis, the other of said cam and cam lever means comprisin first translatable means having a flat surface and sai one of said cam and cam lever means comprises second pivotal means having first and second curve surfaces contacting said flat surface at said first an second points respectively when in said stable posi tion.

16. A positioning mechanism in accordance with clain 15 and further comprising means for translating said pivo axis.

References Cited

UNITED STATES PATENTS

| | | | |
|---|---|---|---|
| 2,811,045 | 10/1951 | Thompson ---------- | 74—10.3 |

FOREIGN PATENTS

| | | |
|---|---|---|
| 691,113 | 10/1930 | France. |

MILTON KAUFMAN, *Primary Examiner.*